(12) United States Patent
Buchanan et al.

(10) Patent No.: US 10,180,820 B2
(45) Date of Patent: Jan. 15, 2019

(54) MULTIPLY-ACCUMULATE CIRCUITS

(71) Applicant: Hewlett Packard Enterprise Development LP, Houston, TX (US)

(72) Inventors: Brent Buchanan, Fort Collins, CO (US); Le Zheng, Palo Alto, CA (US); John Paul Strachan, San Carlos, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 200 days.

(21) Appl. No.: 15/282,021

(22) Filed: Sep. 30, 2016

(65) Prior Publication Data

US 2018/0095722 A1    Apr. 5, 2018

(51) Int. Cl.
*G06F 7/523*    (2006.01)
*G06F 7/544*    (2006.01)
*G11C 13/00*    (2006.01)

(52) U.S. Cl.
CPC ............ *G06F 7/523* (2013.01); *G06F 7/5443* (2013.01); *G06F 2207/4802* (2013.01); *G06F 2207/4828* (2013.01); *G11C 13/004* (2013.01); *G11C 13/0007* (2013.01); *G11C 13/0028* (2013.01)

(58) Field of Classification Search
None
See application file for complete search history.

(56) References Cited

U.S. PATENT DOCUMENTS

| | | | |
|---|---|---|---|
| 4,775,851 A | 10/1988 | Borth | |
| 7,711,765 B2 | 5/2010 | Wang et al. | |
| 9,292,297 B2 | 3/2016 | Gopal et al. | |
| 9,679,242 B2* | 6/2017 | Nugent | G06N 3/063 |
| 2002/0116186 A1 | 8/2002 | Strauss et al. | |
| 2012/0175583 A1* | 7/2012 | Nugent | H03K 19/00 257/5 |
| 2018/0075339 A1* | 3/2018 | Ma | G06N 3/04 |

OTHER PUBLICATIONS

Alibart F. et al., "High Precision Tuning of State for Memristive Devices by Adaptable Variation-Tolerant Algorithm", (Web Page), Jan. 29, 2012, 7 pages.

* cited by examiner

*Primary Examiner* — Micahel D. Yaary
(74) *Attorney, Agent, or Firm* — Hewlett Packard Enterprise Patent Department

(57) ABSTRACT

In some examples, a method may be performed by a multiply-accumulate circuit. As part of the method a row driver of the multiply-accumulate circuit may drive a row value line based on an input vector bit of an input vector received by the row driver. The row driver may also drive a row line that controls a corresponding memristor according to the input vector bit. The corresponding memristor may store a weight value bit of a weight value to apply to the input vector for a multiply-accumulate operation. The method may further include a sense amplifier generating an output voltage based on a current output from the corresponding memristor and counter circuitry adjusting a counter value that represents a running total of the multiply-accumulate operation based on the row value line, the output voltage generated by the sense amplifier, or a combination of both.

19 Claims, 6 Drawing Sheets

MULTIPLY-ACCUMULATE CIRCUITS

STATEMENT OF GOVERNMENT RIGHTS

This invention was made with Government support. The Government has certain rights in the invention.

BACKGROUND

With rapid advances in technology, computing systems are used in virtually all aspects of society today. Computing systems and devices are increasing in complexity and processing capability, and may perform computational operations on data sets of immense sizes. Increases in the efficiency and capability of computing and memory systems will result in further widespread use and adoption of technology in nearly every facet of life.

BRIEF DESCRIPTION OF THE DRAWINGS

Certain examples are described in the following detailed description and in reference to the drawings.

DETAILED DESCRIPTION

Examples consistent with the present disclosure may provide memristor-based multiply-accumulate circuits. The various multiply-accumulate architectures disclosed herein may include a set of memristor circuits, control logic, and a digital counter to support computation of multiply-accumulate operations. Through use of memristor technologies and hardware-based computational logic, the features disclosed herein may increase the efficiency at which (often times complex and costly) multiply-accumulate operations are computed. As described in greater detail below, the multiply-accumulate circuits provided herein may use a fixed read voltage to access multiply-accumulate operands stored in memristors, which may reduce corruptions from the non-linear current-voltage (IV) relationship of memristors and avoid reduced signal-to-noise ratios from scaled input vector operands. The features described herein may also support outputting the result of a multiply-accumulate operation as a digital value, which may reduce the need for separate conversion hardware (e.g., analog-to-digital converters) as well as a corresponding reduction in area or power expenses.

Figure 1:
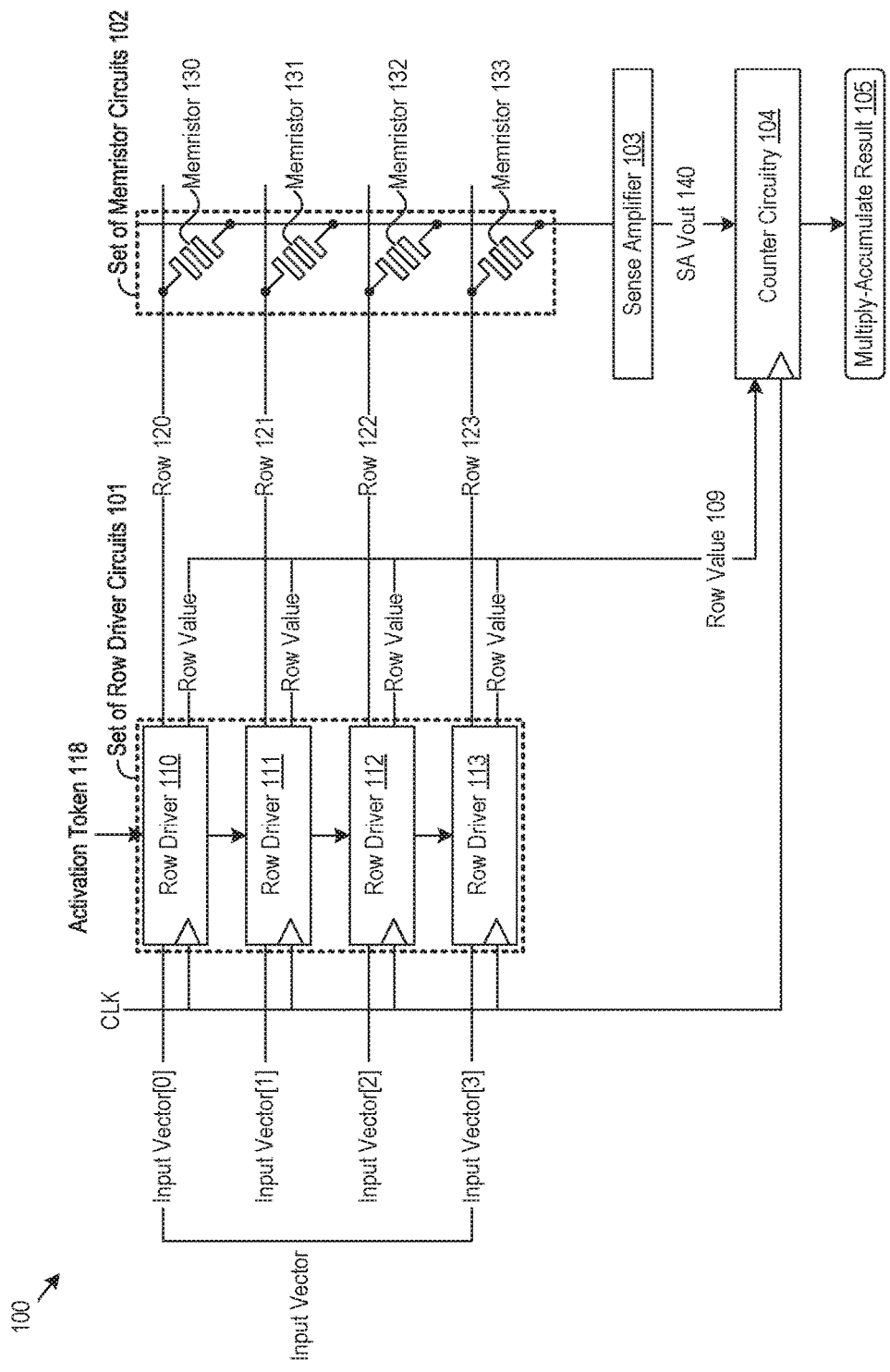
FIG. 1 shows an example of a multiply-accumulate circuit.

FIG. 1 shows an example of a multiply-accumulate circuit 100. The multiply-accumulate circuit 100 may perform multiply-accumulate operations (also referred to as dot-product operations) between operands. Multiple-accumulate operations may be used in various contexts, for example image processing, in neural networks, image convolution with kernel weighting, and in several other ways. As a specific example of operands, the multiply-accumulate circuit 100 may perform a multiply-accumulate operation between an input vector (e.g. image data samples) and a weight value (e.g., a convolution kernel).

In several of the examples discussed below, the multiply-accumulate circuit 100 is described with respect to operands in the form of oversampled and noise-shaped samples of input signals (e.g., a high resolution input signal). As such, one example multiply-accumulate operand is an input vector formed as 1-bit sample values oversampled from a noise-shaped input signal. Another example multiply-accumulate operand is a weight value formed as 1-bit sample values oversampled from a noise-shaped filter kernel. In such examples, both the input signal and the weight value may be oversampled and noise-shaped, thus taking the form of 1-bit sample values obtained from respective signals. In performing a multiply-accumulate operation on such operands, the multiply-accumulate circuit 100 may compute bit-by-bit products between respective bit values of the input vector and weight value bits.

To illustrate, for operands represented as a sequence of 1-bit values, the multiply-accumulate circuit 100 may perform a multiply-accumulate operation through a series of bit-by-bit product computations. Computation of a result y of a multiply-accumulate operation between an input vector and a weight value may be represented as the following:

$$y = \text{input vector}[0]*\text{weight}[0] + \text{input vector}[1]*\text{weight}[1] + \ldots$$

The individual products between bits of the input vector and weight value are summed to form the multiply-accumulate result. A bit-by-bit product computation may thus refer to the particular product computation between a pair of particular bits (e.g., samples) of multiply-accumulate operands (e.g., input vector[n]*weight[n] as the $n^{th}$ bit-by-bit product in the multiply-accumulate operation). The multiply-accumulate circuit 100 may perform a multiply-accumulate operation between operands comprising (or representing) 1-bit values through the summing of respective bit-by-bit product computations that form the operation.

The multiply-accumulate circuit 100 may include various circuitry to support performing multiply-accumulate operations through computing and summing bit-by-bit product computations. In the example architecture shown in FIG. 1, the multiply-accumulate circuit 100 includes a set of row driver circuits 101, a set of memristor circuits 102, a sense amplifier 103, and counter circuitry 104. For illustrative purposes, the operands of multiply-accumulate operations performed by the multiply-accumulate circuit 100 are described as an input vector (e.g., a sequence of 1-bit per sample voltages from an input signal) and a weight value (e.g., a vector of 1-bit per sample values from a filter kernel signal). Various other types of operands may be supported by the multiply-accumulate circuit as well, including any type operand that takes the form of strings of 1-bit values or samples.

As noted above, the multiply-accumulate circuit 100 may support computation of products between 1-bit sample values (e.g., between a bit of an input vector and a corresponding bit of a weight value). Respective bit-by-bit product computations may be performed by respective rows of the multiply-accumulate circuit 100. A particular row in the multiply-accumulate circuit 100 may include a row driver and a corresponding memristor.

As described in greater detail below, the row driver may control row operation and output a row value indicative of a particular bit-value of an input vector (e.g., input vector[0] representing a first bit of the input vector). The corresponding memristor of a row may output a current based the resistive state of the memristor, and the resistive state may correlate to a particular bit-value of a stored weight value (e.g., weight[0] representing a first bit of the weight vector). The sense amplifier 103 may convert the current output from memristors to a voltage value, for example outputting a '1' value or '0' value based on the current output from the corresponding memristor. The current output from the memristor, and thus the output voltage applied by the sense amplifier 103, may represent a particular weight value bit stored by the corresponding memristor. The counter circuitry 104 may receive the row driver and sense amplifier outputs for a particular row (e.g., representative of input vector[0] and weight[0]), and may adjust a counter value to account for a particular bit-by-bit product computation of the multiply-accumulate operation represented by the particular row (e.g., input vector[0]*weight[0]). On a row-by-row basis, the multiply-accumulate circuit 100 may perform a multiply-accumulate operation between an input vector and a weight value. The elements 101, 102, 103, and 104 of the multiply-accumulate circuit 100 are described in greater detail next.

The set of row driver circuits 101 may serve as control logic for the multiply-accumulate circuit 100. In doing so, the set of row driver circuits 101 may control when a particular row is activated to output bit-value for product computations in the multiply-accumulate operation. The actual computation of the bit-by-bit product may be performed or effectuated by counter circuitry (discussed in greater detail below), and the set of row driver circuits 101 may control when a particular row is active to provide inputs to the counter circuitry. Operation of a particular row driver may include outputting a row value representative of an input vector bit to a row value line 109 to the counter circuitry. The particular row driver may also drive a row line to activate a corresponding memristor storing a weight value bit for the bit-by-bit product computation.

In the example shown in FIG. 1, the multiply-accumulate circuit 100 includes the row drivers 110, 111, 112, and 113. Each of the row drivers 110-113 may receive an input vector bit of an input vector. In FIG. 1 for example, the row driver 110 receives bit 0 of an input vector (shown as input vector[0]), the row driver 111 receives bit 1 of the input vector (shown as input vector[1]), and so on. The row drivers 110-113 also output a respective row value to drive (e.g., activate) a corresponding memristor. In the example shown in FIG. 1, the row driver 110 drives a voltage value onto the row line 120 to activate a corresponding memristor (e.g., the memristor 130), the row driver drives a voltage value onto the row line 121, and so on for row lines 122 and 123.

An input vector with a size of 4-bits (e.g., 4 1-bit samples) is shown in the example of FIG. 1, and thus four row drivers are illustrated. However, the number of row drivers and memristors implemented or used by the multiply-accumulate circuit 100 may vary depending on operand sizes. Kernel weights may span thousands, to tens of thousands of bits or more, and the multiply-accumulator circuit 100 may implement or program any numbers of row drivers and corresponding memristors to support multiply-accumulate computations of such sizes or more.

In operation, a single row of the multiply-accumulator circuit 100 may be active at a particular time. The multiply-accumulate circuit 100 may control activation of the various row drivers (and thus corresponding rows) through an activation token 118. The activation token 118 may take the form of a 1-bit value (e.g., a 1-value) and the multiply-accumulate circuit 100 may ripple the activation token 118 through the set of row driver circuits 101. For example, the multiply-accumulate circuit 100 may include a token propagation unit to propagate a '1' value through the set of row driver circuits 101, A particular row may be activated when activation logic (e.g., a shift register) of the row driver stores or latches the propagated '1' value. When a row is active, a row driver, corresponding memristor, or both, may output values representative of the input vector and weight value to counter circuitry, and the counter circuitry may adjust a counter value to account for a bit-by-bit product computation of the represented values output by the row driver and memristor circuit.

As an example illustration, when a row of the multiply-accumulate circuit 100 that includes the row driver 110 is activated (e.g., the activation token 118 is latched and local), the row driver 110 may activate a corresponding memristor circuit by driving a particular memristor read voltage value to trigger or activate operation of the corresponding memristor. During a subsequent time period (e.g., clock cycle), the row driver may propagate the activation token 118 to a subsequent row for activation. Thus, the row drivers of the multiply-accumulate circuit 100 may control row activations, which may determine when corresponding memristors are activated and when row value and memristor outputs are provided to the counter circuitry 104 for bit-by-bit product computations in the multiply-accumulate operation.

The set of memristor circuits 102 may include the various memristor circuits that are part of respective rows of the multiply-accumulate circuit 100. The set of memristor circuits 102 may be linked to the set of row driver circuits 101. In the example shown in FIG. 1, the set of memristor circuits 102 includes the memristor circuits 130-133, each of which correspond to a particular row driver. A memristor (also referred to as a memristor circuit) may refer to a memory with a programmable variable resistance. In that regard, memristors may be resistive-based non-volatile memories, and each memristor may store data (e.g. a bit value) based on the resistive state of the memristor. In some examples, a memristor may be programmed with a low resistive state (LRS) to represent storing a '1' value and be programmed with a high resistive state (HRS) to represent storing a '0' value, e.g., for the particular bit value of a weight value, kernel, or other multiply-accumulate operand programmed into a memristor set of a multiply-accumulate circuit 100.

To support reading of stored memristor values, memristors of the set of memristor circuit 102 may each be linked to a sense amplifier 103. Based on the current that is output from a memristor responsive to an applied read voltage, the sense amplifier 103 may generate or apply an output voltage, shown as SA Vout 140 in FIG. 1. The output voltage SA Vout 140 may thus represent the bit value stored in a memristor as a voltage value.

As an illustration provided through FIG. 1, the memristor 132 may be activated for reading by a corresponding row driver 112 (e.g., by driving the row line 122). The memristor 132 may provide a high current output to the sense amplifier 103 when the memristor 132 is programmed in a low resistive state. Responsive to a high current output from the memristor 132, the sense amplifier 103 may apply an output voltage SA Vout 140 as a '1' value to represent the '1' value stored by the memristor 132. In another case, the memristor 132 may provide a low current output when the memristor 132 is programmed to a high resistive state, and the sense amplifier 103 may apply an output voltage SA Vout 140 as a '0' value instead.

In that regard, the sense amplifier 103 may output, for a particular memristor, a value representative of a bit value stored by the memristor. As memristor activations in the multiply-accumulate circuit 100 may be controlled by the row drivers, a particular memristor of the set of memristor circuits 102 may provide a current output to the sense amplifier 103 responsive to activation by the corresponding row driver through the row line (e.g., when the activation token 118 is local to the corresponding row driver).

The counter circuitry 104 may store a counter value and to adjust the counter value based on a row value output from the set of row driver circuits 101, the output voltage of the sense amplifier 103, or both. For a particular bit-by-bit product computed for a particular row (e.g., row 'n' representing a product between bits input vector[n]*weight[n]), the result of a 1-bit by 1-bit multiply operation may be a value of −1, 0, or 1 depending on the particular bit values and the universe of values the input vector and weight value bits make take. The possible product values of the bit-by-bit product computation (−1, 0, or 1) may be captured and accounted for through adjusting a counter value, e.g., as successive rows of the multiply-accumulate circuit 100 are activated. The counter circuitry 104 may thus increment, decrement, or take no action based on the particular bit-values stored in the row driver and corresponding memristor of a row. After rows of the multiply-accumulate circuit 100 have been activated and accounted for by the counter circuitry 104, the counter value maintained by the counter circuitry 104 may store the result of the multiply-accumulate operation (shown in FIG. 1 as the multiply-accumulate result 105).

The particular implementation of the counter circuitry 104 may vary depending on the range of values that operands of the multiply-accumulate operation may take (e.g., the universe of sample values that the input vector or the weight value may include). In some examples, input vector bits (0 or 1) represent corresponding positive and negative sample values of an operand, e.g., input vector[n]∈{0,1} represent actual input vector values ∈{−1,1}. In other examples, the input vector bits of the input vector (0 or 1) represent zero and positive values, e.g., input vector[x]∈{0,1} represent actual input vector values ∈{0,1}. In a similar way, the weight values stored in memristors of a multiply-accumulate circuit may have actual bit values of 0 or 1, but represent negative and positive weight values. A '0' value for the weight value bit stored by a memristor may represent an actual weight value of '−1' and a '1' value for a weight value bit stored by the memristor may represent an actual weight value of '1'.

In these varying scenarios, the row drivers and counter circuitry of a multiply-accumulate circuit may be implemented differently to support the different universe of operand values used in multiply-accumulate operations. Example implementations of row drivers and counter circuitry as well as other features of memristor-based multiply-accumulate circuits are described next.

Figure 2:
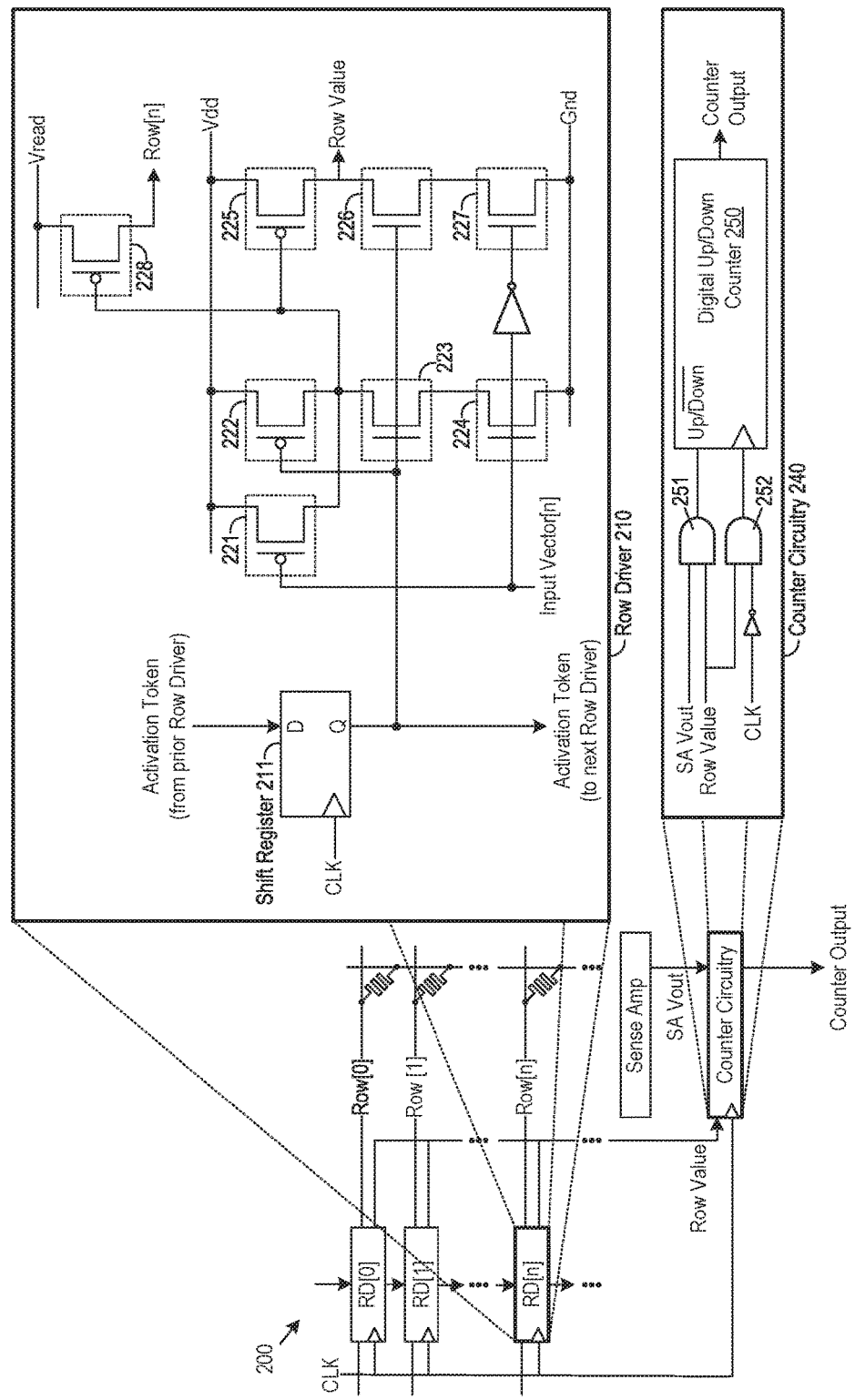
FIG. 2 shows an example multiply-accumulate circuit with example implementations of a row driver and counter circuitry.

FIG. 2 shows an example multiply-accumulate circuit 200 with example implementations of a row driver and counter circuitry. The multiply-accumulate circuit 200 may perform multiply-accumulate operations on various operands, such as an input vector that includes a series of 1-bit values representing actual operand values ∈{0,1} and a weight value that includes a series of 1-bit weight values representing positive and negative weight values ∈{−1,1}. A set of memristor circuits of the multiply-accumulate circuit 200 may be respectively programmed to store bits of the weight value. A stored weight value bit of '0' (e.g., a memristor programmed to a HRS, with a low current output, and causing a sense amplifier output of a low voltage) may represent an actual weight value of '−1' whereas a stored weight value bit of '1' may represent an actual weight value of '1'.

The row drivers and counter circuitry of the multiply-accumulate circuit 200 may perform multiply-accumulate operations in view of the universe of values of the respective bits of the input vector and weight value. In the example shown in FIG. 2, the multiply-accumulate circuit 200 includes a set of row drivers, one example of which is shown as through the row driver 210. The row driver 210 may control operation of row 'n' of the multiply-accumulate circuit 200, and other rows may similarly include a respective row driver and corresponding memristor.

In operation, the row driver 210 may control row operation based on an activation token propagated through the multiply-accumulate circuit 200. The activation token may indicate when a particular row is active, which the row driver 210 may track, latch, store, or identify through a shift register or other circuitry. The row driver 210 may receive an activation token from a previous row driver and propagate the activation token to a subsequent row driver. To support such propagation, a set of row drivers of a multiply-accumulate circuit may respectively implement a particular shift register of a shift-register chain through which the activation token is propagated. Prior to computing the multiply-accumulate operation, a multiply-accumulate circuit may initialize each of shift register values to '0' and then propagate the activation token as a '1' value through the shift register chain.

An activation token may be referred to as local to a particular row driver or a particular row when the particular row driver latches or stores the activation token. When the activation token is local to the row, the row driver 210 may drive a row line (shown as the line row[n] of the multiply-accumulate circuit 200) and output a row value to the row value line. The row line may activate the corresponding memristor, e.g., to cause the corresponding memristor to generate a current output based on the resistive state programmed for the corresponding memristor. To do so, the row driver 210 may drive the row line with a memristor read voltage, which may be referred to as Vread as shown in FIG. 2. When the activation token is local to a row, the row driver 210 may also drive a row value line. The row value output by the row driver 210 may be a voltage value reflective of an input vector bit received by the row driver 210. When the row is active (e.g., the activation token is local), the row driver 210 may output the row value and drive the row line to activate (e.g., read) the corresponding memristor.

Operation of the row driver 210 may vary depending on the specific value of a received input vector bit. In the example shown in FIG. 2, the row driver 210 receives bit 'n' of an input vector, which may be a '0' or '1' value. When input vector[n]=0 and the activation token is local, the row driver 210 may drive a low value to the row value line. When input vector[n]=1 and the activation token is local, the row driver 210 may drive a high value onto the row value line. The row driver 210 may cause the row value line to float otherwise, e.g., when the activation token is not local. With regards to the row line, the row driver 210 may drive the row line high (e.g., with a voltage equal Vread) when both the activation token is local and input vector[n]=1, and cause the row line to float otherwise.

The row driver 210 may drive the row line row[n] with a Vread voltage to activate a corresponding memristor. The row driver 210 may use a Vread voltage value that reduces corruption caused by the non-linear IV relationship of memristors. For example, the row driver 210 may drive the row line with a Vread voltage that is set to a maximum non-disturb read voltage for memristors of the multiply-accumulate circuit 200 (or within a predefined threshold of the maximum non-disturb read voltage). As such, use of the Vread voltage to drive the row line may increase the signal-to-noise ratio of memristor accesses and improve circuit operation. Through the row driver 210 driving a specified Vread voltage to access memristors, a multiply-accumulate circuit may avoid scaling issues from direct analog inputs and operands required to not exceed the disturb voltage of memristors, which may result in scaling relatively lower input values to even smaller values.

In some examples, the row driver 210 may prevent or determine not to activate a corresponding memristor when the activation token is local and input vector[n]=0. In such a case when the 0 value of input vector[n] represents an actual operand bit value of 0, the bit-by-bit product computation represented by the row may be equal to 0 regardless of the weight value bit stored in the corresponding memristor of the row. Accessing the weight value bit stored in the memristor would have no effect on the multiply-accumulate result. As such, the row driver 210 may reduce resource consumption and increase circuit efficiency by not activating the corresponding memristor to read the stored weight bit value.

The multiply-accumulate circuit 200 may utilize any row driver architecture that operates as described above for the row driver 210. One example architecture is shown in FIG. 2. The row driver 210 shown in FIG. 2 includes a shift register 211 through which the row driver 210 may latch and propagate an activation token. The shift register 211 may take the form of a D-latch or any other circuit or memory element. Each of the row drivers in a multiply-accumulate circuit 200 may include a shift register, which may be initialized to a 0 value prior to performing a multiply-accumulate operation. As the activation token propagates through the various shift registers of the row drivers, respective rows may be activated initiating bit-by-bit product computations summed to obtain the multiply-accumulate result.

The example architecture of the row driver 210 in FIG. 2 also includes circuitry to drive the row value line and row line (row[n] for the row driver 210). In particular, the row driver 210 shown in FIG. 2 includes transistors 221-228, which may take the form of metal oxide semiconductor field-effect transistors (MOSFETs) or other types of transistors. Transistors 221, 222, 225, and 228 are shown as PMOS transistors, each with a terminal tied to Vdd or Vread and short circuits when a '1' value (high voltage) is applied to the transistor gate. Transistors 223, 224, 226, and 227 are shown as NMOS transistors and short circuits when a '0' value (low voltage) is applied to the transistor gate.

Transistors 221-224 may effectively form a NAND gate, the output of which drives the gate of transistor 228 and thus controls the row line (row[n]) of the row driver 210. When the activation token is local (which may be evidenced when a high voltage is output from the shift register 211) and when input vector[n]=1, a low voltage (ground voltage, shown as Gnd in FIG. 2) may be applied to the gate of transistor 228, driving the line row[n] with Vread. At other times when the activation token is not local, when input vector[n]=0, or when both occur, the Vdd voltage may be applied to the gate of transistor 228, causing the row line row[n] to float. Thus, the row driver 210 may drive row[n] high when both the activation token is local and input vector[n]=1, and cause row[n] to float otherwise.

The row driver 210 may control the row value line through the NAND gate formed by transistors 221-224 as well as the transistors 225, 226, and 227. The output of the NAND gate formed by transistors 221-224 may drive the gate for transistor 225. As such, the transistor 225 may drive the row value line high with Vdd when both the activation token is local and input vector[n]=1. In such a case, the inverse of input vector[n] (i.e., a '0' value, the inverse of input vector[n]=1) drives the gate of transistor 227, shorting the connection between the row value line and the ground signal. When the activation token is local and input vector [n]=0, Vdd is applied to the gate of transistor 225, short circuiting the transistor 225. Instead, the row value line is driven by transistors 226 and 227, both of which conduct due to a high voltage value applied to the respective transistor gates. Thus, the row value is driven with a '0' value (ground) when the token is local and input vector[n]=0. When the token is not local, a low voltage is applied to the gate of transistor 226 and a high voltage is applied to the gate of transistor 225, causing the row value line to float (this is the case regardless of the value of input vector[n] when the activation token is not local). Accordingly, the row driver 210 may drive the row value line high when the activation token is local and input vector[n]=1, drive the row value line low when the activation token is local and input vector[n]=0, and cause the row value line to float otherwise.

Turning to the counter circuitry of the multiply-accumulate circuit 200, the multiply-accumulate circuit 200 shown in FIG. 2 includes counter circuitry 240 to maintain a counter value in performing the multiply-accumulate operation. The counter circuitry 240 may adjust the counter value to represent the running total of the multiply-accumulate operation as bit-by-bit product computations are performed in a row-by-row manner. The counter circuitry 240 may be implemented to account for the possible results of bit-by-bit product computations from represented input vector values $\in\{0,1\}$ and represented weight values $\in\{-1, 1\}$. When the activation token is local to a particular row, the row driver of the particular row may output a row value to counter circuitry (e.g., input vector[n]$\in\{0,1\}$ and drive a row line to read a corresponding memristor, which may cause a sense amplifier to produce an output voltage SA Vout for a programmed weight value $\in\{0,1\}$ representing actual weight values $\in\{-1,1\}$.

The counter circuitry may adjust the counter value by incrementing, decrementing, or taking no action based on the row value output from a particular row driver and the output voltage applied by a sense amplifier based on the current output of a corresponding memristor circuit. Four different scenarios may occur when a particular row 'n' of the multiply-accumulate circuit 200 is activated: (i) row value=0 and SA Vout=0 (indicative of a programmed memristor value representing an actual weight value of −1); (ii) row value=0 and SA Vout=1; (iii) row value=1 and SA Vout=0 (representing an actual weight value of −1); and (iv) row value=1 and SA Vout=1. When row value=0 (e.g., input vector[n]=0), bit-by-product between input vector[n] and the represented weight value is 0, regardless of whether the actual weight value is −1 (represented by SA Vout=0) or 1 (represented by SA Vout=1). As noted above, when input vector[n]=0, the row driver 210 may cause the row line to float, preventing activation and reading of a corresponding memristor as the bit value programmed into the corresponding memristor will not change the result of the product computation. A product computation result of 0 will not cause the multiply-accumulate result to increase or decrease. As such, when row value=0 (representing scenarios (i) and (ii) above), the counter circuitry 240 may take no action with regards to the counter value.

When the row value line is driven high (e.g., input vector[n]=1) and SA Vout is low (scenario (iii) above), the counter circuitry 240 may decrement the counter value. In such a case, the output voltage from the sense amplifier SA Vout may have a low value when the corresponding memristor of an activated row is programmed in a HRS, representing an actual operand weight value of −1. Thus, the product computation between the input vector[n] and weight value[n] is 1*−1=−1. In such a case, the counter circuitry 240 may decrement the counter value to reflect the product computation result.

When the row value line is driven high (e.g., input vector[n]=1) and SA Vout is high (scenario (iv) above), the counter circuitry 240 may increment the counter value. The output voltage from the sense amplifier SA Vout may have a high value when the corresponding memristor of an activated row is programmed in a LRS, representing an actual operand weight value of 1. Thus, the product computation between the input vector[n] and weight value is 1*1=1. In such a case, the counter circuitry 240 may increment the counter value to reflect the product computation result for a particular row of the multiply-accumulate circuit 200.

As described above, the counter circuitry 240 may increment, decrement, or take no action with respect to a counter value based on bit-values output from a row driver and corresponding memristor (and sense amplifier). The counter circuitry 240 may increment the counter value when an input vector bit received by a particular row driver is a '1' value and the corresponding memristor stores a '1' value for the weight value bit, decrement the counter value when the input vector bit received by the particular row driver is a '1' value and the corresponding memristor stores a '0' value for the weight value bit; and take no action when the input vector bit received by the particular row driver is a '0' value. A multiply-accumulate circuit may implement the counter circuitry 240 in any way to support such operation. One example architecture is shown in FIG. 2.

In the example shown in FIG. 2, the counter circuitry 240 includes a digital up/down counter 250 and other control logic. The digital up/down counter 250 may increment or decrement a counter value based on a clock signal (e.g., at the rising edge) based on the value of an up/down input to the digital up/down counter 250. The digital up/down counter 250 may increment the counter value when the up/down input is 1 (high voltage) and decrement the counter value when the up/down input is 0 (low voltage).

Through use of a digital up/down counter 250, the multiply-accumulate circuit 200 may obtain a multiply-accumulate result that is natively digital. As such, the multiply-accumulate circuit 200 may support computation of a multiply-accumulate operation on, for example, over-sampled analog inputs and generate a result that is digital. Such a digital result may be computed without use of analog-to-digital converters or other dedicated circuitry, which may reduce area, power, and computation expenses.

To control operation of the digital up/down counter 250, the counter circuitry 240 may include control logic. The control logic may drive the control input of the digital up/down counter 250, which controls whether the counter 250 increments or decrements the stored counter value. The control logic may also control the clock input to the digital up/down counter 250. In FIG. 2, such control logic takes the form of AND gates 251 and 252 and an inverter. The AND gate 251 takes the row value and SA Vout lines as inputs and the AND gate 252 takes the row value line and an inverted clock signal as inputs. The AND gate 252 causes the digital up/down counter 250 to increment or decrement on a falling edge of the clock signal when row value=1. No action is taken otherwise.

Whether an increment or decrement command is provided to the control input of the digital up/down counter 250 depends on SA Vout, e.g., whether the weight value represented by a programmed weight value bit into a corresponding memristor represents an actual weight value of '−1' (when the memristor is programmed into a HRS and SA Vout has a '0' value) or '1' (when the memristor is programmed into a LRS and SA Vout has a '1' value). In such cases, when SA Vout=0, the AND gate 251 outputs a '0' value, causing the counter value to decrement on a falling clock edge (when row value=1). When SA Vout=1, the AND gate 251 outputs a '1' value, causing the counter value to increment on a falling clock edge (when row value=1).

Thus, the counter circuitry 240 may be implemented to include a digital counter and control logic to increment, decrement, or take no action based on the value of received inputs from a row value line (e.g., representing input vector [n]) and SA Vout (e.g., representing weight value[n]). The counter circuitry 240 may store the result of a multiply-accumulate operation between an input vector and a weight value after each row driver and corresponding memristor of the multiply-accumulate circuit 200 have been activated. Table 1 below may summarize operation of a particular row 'n' of the multiply-accumulate circuit 200 according to various value combinations of input vector[n] and weight value[n].

TABLE 1

Example Operation of a Multiply-Accumulate Circuit

| Input Vector[n] | Weight Value[n] | Row Value | Memristror[n] Resistive State | SA Vout | Counter Circuitry Action |
|---|---|---|---|---|---|
| 0 | 0 (representing −1) | 0 | HRS | — (no memristor read) | No Action |
| 1 | 0 (representing −1) | 1 | HRS | 0 | Decrement |
| 0 | 1 | 0 | LRS | — (no memristor read) | No Action |
| 1 | 1 | 1 | LRS | 1 | Increment |

Note that in Table 1 above, the output voltage of the SA Vout signal from a sense amplifier is shown as not applicable when input vector[n]=0, as a row driver[n] may determine not to activate a corresponding memristor[n] to read the programmed value. In actual operation, the sense amplifier may output a low value as no current will be provided by the corresponding memristor[n] when input vector[n]=0. Regardless of the output voltage SA Vout, the counter circuitry 240 may take no action when input vector[n]=0 as the bit-by-bit production computation for input vector[n]=0 will not change the running total of the multiply-accumulate operation tracked by the counter value.

In some implementations, a multiply-accumulate circuit may implement row driver circuitry to bypass rows when the bit-by-bit production computation represented by the row does not change the total of the multiply-accumulate operation. Such scenarios may arise for rows in which input vector[n]=0, two example scenarios of which are shown in Table 1 above. In that regard, a multiply-accumulate circuit may implement bypass circuitry as part of a row driver (or other circuit component) to bypass row activations for circuit rows that will not affect the multiply-accumulate total. An example implementation is shown next in FIG. 3.

Figure 3:
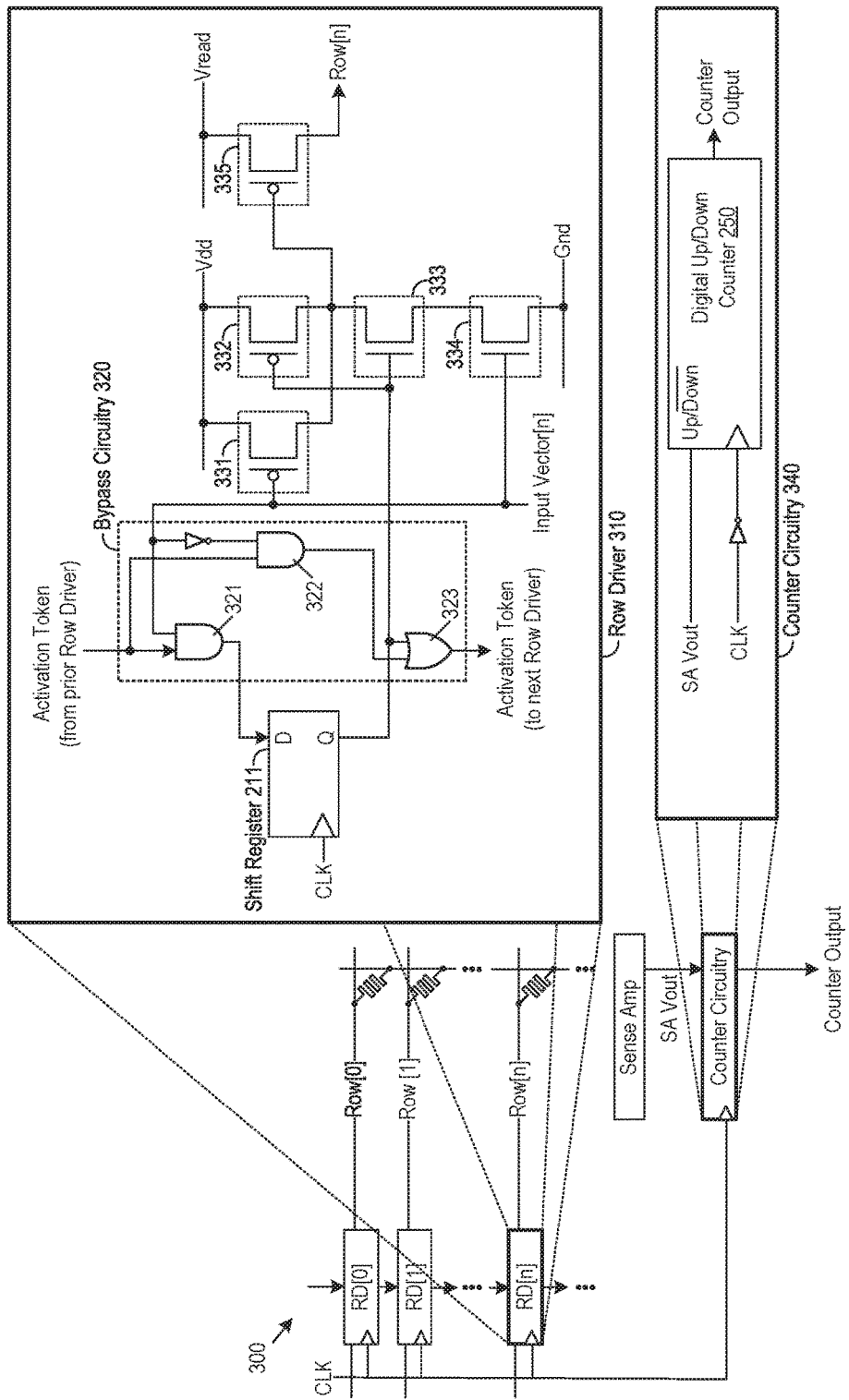
FIG. 3 shows an example of a multiply-accumulate circuit that includes an example row driver with bypass circuitry.

FIG. 3 shows an example of a multiply-accumulate circuit 300 that includes an example row driver with bypass circuitry. As with the multiply-accumulate circuits described above, the multiply-accumulate circuit 300 shown in FIG. 3 includes multiple rows, each of which may include a row driver and a corresponding memristor. The example implementation of the row driver 310 in FIG. 3 includes bypass circuitry 320. The bypass circuitry 320 may support propagation of an activation token to a subsequent row when the value of input vector[n] received by the row driver 310 does not change the result of the multiply-accumulate operation (e.g., when input vector[n]=0). In that regard, the bypass circuitry 320 may bypass activation of a row driver (and thus the corresponding memristor of the row) when the input vector bit received by the row driver is a '0' value.

In the example implementation shown in FIG. 3, the bypass circuitry 320 includes the AND gates 321 and 322 and the OR gate 323. While one specific example is shown in FIG. 3, the bypass circuitry 320 may be implemented in various different ways to support the features described herein. The bypass circuitry 320 may latch the activation token when input vector[n]=1. Described in another way, the bypass circuitry 320 may cause the activation token to stop or remain local to a row when input vector[n]=1. The AND gate 321 may support the localization of the activation token by outputting a '1' value to the input of shift register 211 when the activation token has been received from a prior row driver and input vector[n]=1. In such scenarios, the activation token may be local to row 'n' of the multiply-accumulate circuit 300, and the row driver 310 may activate the row for a bit-by-bit product computation in the multiply-accumulate operation. Upon latching the activation token, the bypass circuitry 320 may also propagate the activation token (output through the shift register 211) to the next row driver through the OR gate 323.

When the value of input vector[n] received by the row driver 310 is '0', the bypass circuitry 320 may prevent activation of the row. In doing so, the bypass circuitry 320 may propagate the activation token to a subsequent row driver in the multiply-accumulate circuit 300 without latching the activation token. In the example implementation shown in FIG. 3, the AND gate 322 and OR gate 323 may support propagation of a received activation token to a next row driver without latching (or otherwise storing or localizing) the activation token when input vector[n]=0. When the activation token has not been received from a previous row driver, the bypass circuitry 320 may pass a '0' value to the next row driver.

When the activation token is local (e.g., latched by the shift register 211), the row driver 310 may drive a row line to activate a corresponding memristor. In the example implementation in FIG. 3, the row driver 310 includes the transistors 331, 332, 333, 334, and 335 to drive the row line labeled as row[n]. The transistors 331-334 may from a NAND gate, the output of which may drive the gate for a PMOS transistor, transistor 335. Thus, when the activation token is local (and, thus, not bypassed to the next row driver by the bypass circuitry 320) and input vector[n]=1, then a ground voltage may be applied to the gate of transistor 335 driving a Vread voltage onto the row[n] line. In other instances when the activation token is not local (e.g., bypassed) or input vector[n]=0, the row driver 310 may cause the row[n] line to float. As noted above, doing so may prevent activation or reading of the corresponding memristor of the row, which may increase circuit efficiency and reduce resource consumption.

As another example implementation, the row driver 310 may be implemented with transistor 335 but without transistors 331-334. In such a case, the output of the shift register 211 may be inverted to drive the gate to the transistor 335. The shift register 211 may latch the activation token specifically when both the activation token has been propagated from a previous row driver and input vector[n]=1. As such, the shift register 211 may output a '1' value in such cases, but otherwise output a '0' value. Passing the shift register output through an inverter, the inverted output signal of shift register 211 may drive the gate of the transistor 335. In this example implementation, the row driver 310 may thus drive the row[n] line with Vread when the activation token is local and input vector[n]=1, but have the row[n] line float otherwise.

As row drivers may include bypass circuitry, the multiply-accumulate circuit 300 may implement counter circuitry that increments or decrements a counter value based on received inputs from rows of the multiply-accumulate circuit 300. The multiply-accumulate circuit 300 may bypass rows in which the received input vector bit has a value of '0'. Each clock cycle, a row of the multiply-accumulate circuit 300 may be activated that represents a bit-by-bit product computation that either increments or decrements the running total of the multiply-accumulate operation. As such, the activated rows of the multiply-accumulate circuit 300 may either cause the tracked counter value to increment or decrement. The multiply-accumulate circuit 300 in FIG. 3 includes counter circuitry 340 to increment or decrement the counter value based on the activated rows of the multiply-accumulate circuit 300.

The counter circuitry 340 may adjust the counter value in accordance with the value of the weight value bit of the row. As discussed above, an actual weight value (−1 or 1) may be represented and programmed into a corresponding memristor of the row as a weight value bit (0 or 1), which may be output as a voltage value by a sense amplifier. In operation, the counter circuitry 340 may increment the counter value when weight value[n]=1 (represented by a weight value bit of 0) and decrement the counter value when weight value [n]=−1 (represented by a weight value bit of 1). As input vector[n]=1, the bit-by-bit product result of the row is simply the value of weight value[n], e.g., either −1 or 1.

To provide such functionality, the counter circuitry 340 may include the digital up/down counter 250 that receives the SA Vout signal as a control input as well as an inverted clock signal. Because of the activation bypassing of circuit rows of the multiply-accumulate circuit 300 in which input vector[n]=0, the counter circuitry 340 need not receive a row value line, as each activated row has a row value of '1'. Thus, the counter circuitry 340 may receive the SA Vout signal as an input without requiring the row value line as an input. The counter circuitry 340 may increment or decrement the counter value based on the value of weight value [n], ad determined through the specific value of the output voltage SA Vout from the sense amplifier. The counter circuitry 340 may do so at a falling edge of the clock signal, and each increment or decrement of the counter value may represent the bit-by-bit product computation of a particular activated row. After activation of each row of the multiply-accumulate circuit 300 in which input vector[n]=1 (and bypassing of some or all of the rows in which input vector[n]=0), the counter value maintained by the counter circuitry 340 may store the result of the multiply-accumulate operation.

Table 2 below may summarize operation of the multiply-accumulate circuit 300.

TABLE 2

Example Operation of a Multiply-Accumulate Circuit with Bypass Circuitry

| Input Vector[n] | Weight Value[n] | Memristror[n] Resistive State | SA Vout | Counter Circuitry Action | Bypass Circuitry Action |
|---|---|---|---|---|---|
| 0 | −1 | HRS | — (by-passed) | — (by-passed) | Bypass row |
| 0 | 1 | LRS | — (by-passed) | — (by-passed) | Bypass row |
| 1 | −1 | HRS | 0 | Decrement | Latch activation token |
| 1 | 1 | LRS | 1 | Increment | Latch activation token |

Note that in Table 2, a column detailing the row value line is omitted as the bypass circuitry 320 may cause activation of rows in which input vector[n]=1, but prevent activation of rows in which input vector[n]=0.

Through bypass circuitry 320 implemented by row drivers of the multiply-accumulate circuit 300, the multiply-accumulate circuit 300 may selectively activate rows for computation of the multiply-accumulate operation. By skipping activation of rows in which the received input vector bit has a value of '0', the multiply-accumulate circuit 300 may increase circuit efficiency and reduce computation time. Instead of activating each row of the multiply-accumulate circuit 300 (e.g., after a number of clock cycles equal to the number of rows), computation of the multiply-accumulate operation may be completed in a number of clock cycles equal to the number of bits of the input vector with a '1' value, as only these rows may be activated for computation. Also, during each clock cycle, the counter circuitry 340 may increment or decrement the counter value storing the running total of the multiply-accumulate operation, without cycles in which no action is taken. The multiply-accumulate circuit 300 may thus compute the result of a multiply-accumulate operation.

Figure 4:
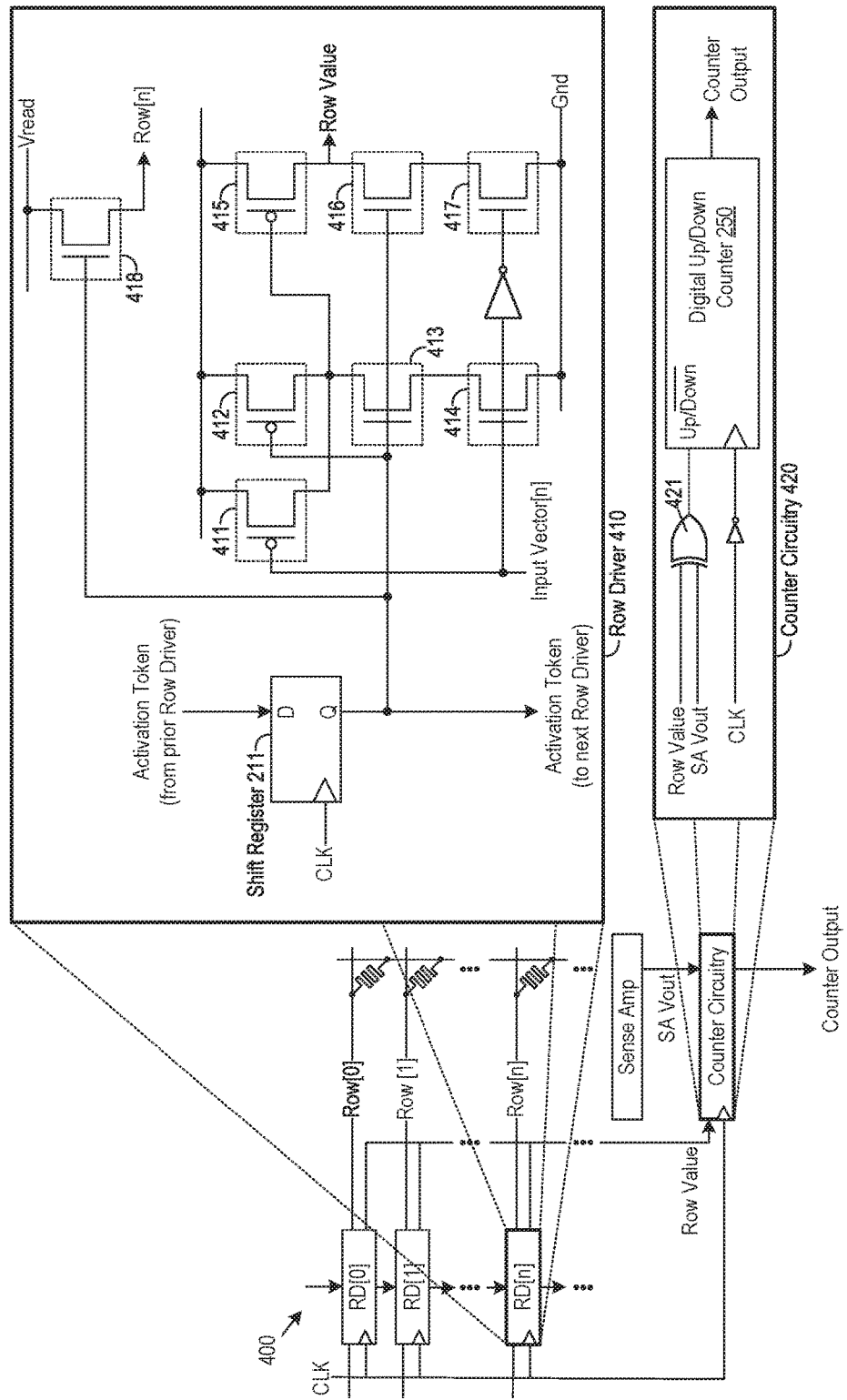
FIG. 4 shows another example of a multiply-accumulate circuit.

FIG. 4 shows another example of a multiply-accumulate circuit 400. In the example shown in FIG. 4, the multiply-accumulate circuit 400 may perform multiply-accumulate operations from input vectors with values ∈{−1, 1}. The input vector values may be represented as 1-bit values with a '0' bit-value representing an actual input vector value of −1 and a '1' bit-value representing an actual input vector value of 1 (e.g., similar to weight values described above).

The row drivers and counter circuitry implemented by the multiply-accumulate circuit 400 may support computation of multiply-accumulate operations involving input vector operands with input values ∈{−1,1} and weight values ∈{−1,1}. In FIG. 4, the multiply-accumulate circuit 400 includes the row driver 410, which may activate a row when the activation token is local, e.g., received and latched from a previous row driver. The example implementation of the row driver 410 shown in FIG. 4 includes the shift register 211 and the transistors 411-418. The transistors 411-417 may operate similarly to, for example, the transistors 221-227 discussed above with respect to FIG. 2. In that regard, when the activation token is local, the row driver 410 may drive the row value line high when input vector[n]=1 and low when input vector[n]=0. When the activation token is not local, the row driver 410 may cause the row value line to float.

With regards to the row line that controls activation and reading of a corresponding memristor, the row driver 410 may drive the row line, shown in FIG. 4 as row[n]. In particular, the row driver 410 may drive the row[n] line high with Vread when the activation token is local and cause the row[n] line to float otherwise. As each row of the multiply-accumulate circuit 400 may affect the multiply-accumulate result, the row driver 410 may activate a corresponding memristor to read the programmed value for each row. To do so, the output of the shift register 211 may drive the gate of the NMOS transistor 418, which may drive the row[n] line with Vread when the activation token is local.

The multiply-accumulate circuit 400 in FIG. 4 also includes the counter circuitry 420. The counter circuitry 420 may increment or decrement a counter value each clock cycle to account for a bit-by-bit product computation represented by a respective rows of the multiply-accumulate circuit 400. For a particular row, the counter circuitry 420 may increment the counter value in two scenarios: (i) when input vector=1 and weight value=1 (represented by row value=1 and SA Vout=1); and (ii) when input vector=−1 and weight value=−1 (represented by row value=0 and SA Vout=0). The counter circuitry 420 may decrement the counter value in two scenarios: (i) when input vector[0]=−1 and weight value=1 (represented by row value=0 and SA Vout=1); and (ii) when input vector=1 and weight value=−1 (represented by row value=1 and SA Vout=0). To provide such operation, the counter circuitry 420 may include an XOR gate 421, the output of which is provided as a control input to a standard up/down counter 250. The counter circuitry 420 may increment or decrement the counter value on the falling edge of a clock signal. After each row of the multiply-accumulate circuit 400 is activated, the counter value maintained by the counter circuitry 420 may store the result of the multiply-accumulate operation.

Table 3 below may summarize the operation of the multiply-accumulate circuit 400.

TABLE 3

Example Operation of a Multiply-Accumulate Circuit

| Input Vector[n] | Weight Value[n] | Row Value | Memristror[n] Resistive State | SA Vout | Counter Circuitry Action |
|---|---|---|---|---|---|
| 0 (representing −1) | −1 | 0 | HRS | 0 | Increment |
| 1 | −1 | 1 | HRS | 0 | Decrement |
| 0 (representing −1) | 1 | 0 | LRS | 1 | Decrement |
| 1 | 1 | 1 | LRS | 1 | Increment |

While example implementations and architectures of various multiply-accumulate circuits, row drivers, counter circuitry, and bypass circuitry were described above, various other implementations are contemplated to support computation of multiply-accumulate operations between various types of operands.

Figure 5:
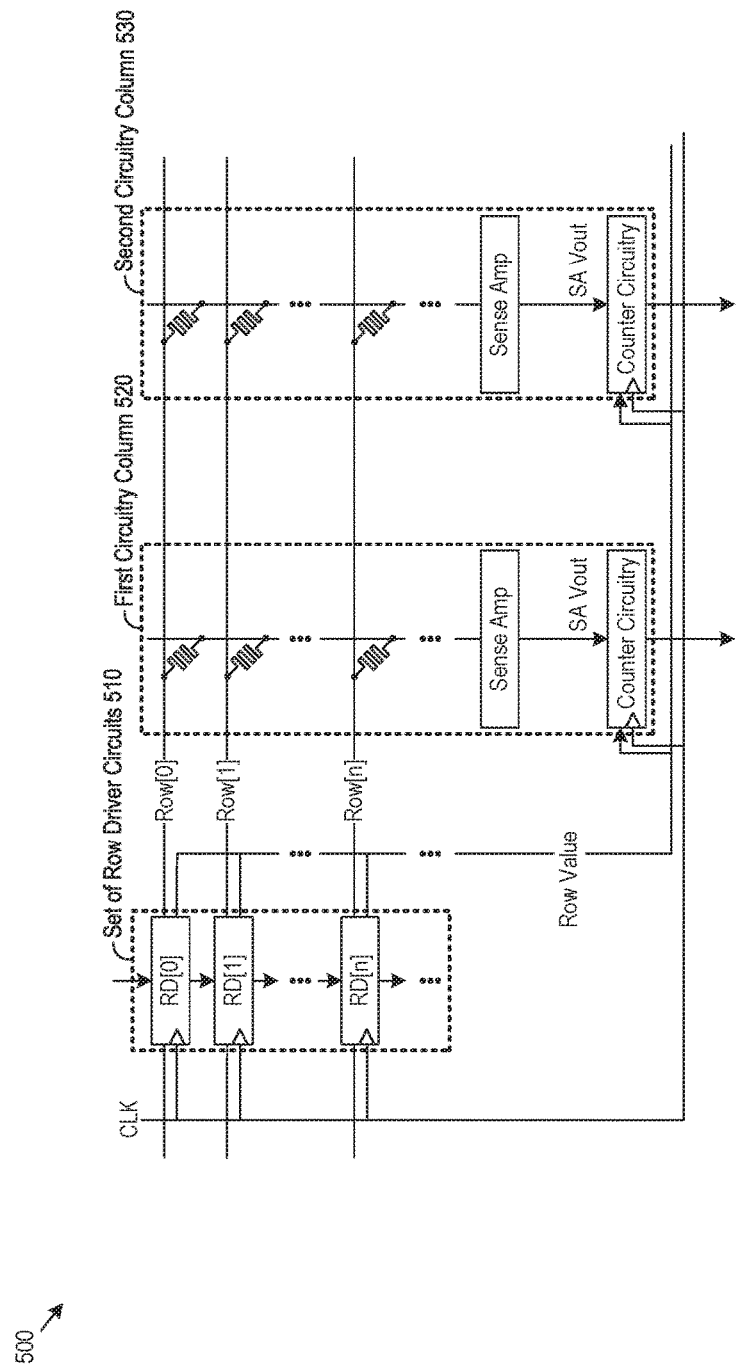
FIG. 5 shows an example of a multiply-accumulate circuit that includes multiple circuitry columns.

FIG. 5 shows an example of a multiply-accumulate circuit 500 that includes multiple circuitry columns. The circuitry columns implemented by the multiply-accumulate circuit 500 may support computation of multiple different multiply-accumulate operations in parallel using different operands. For instance, the multiply-accumulate circuit 500 may support parallel computation of multiple multiply-accumulate operations for a single input vector operand with multiple different weight value operands respectively programmed into different sets of memristor circuits. Parallel multiply-accumulate operations may be useful, for example, in parallel convolving an oversampled input image in the form of an input vector with multiple different convolution kernels or in various other applications.

In the specific example shown in FIG. 5, the multiply-accumulate circuit 500 includes a set of row driver circuits 510, a first circuitry column 520, and a second circuitry column 530. Though two circuitry columns are shown, any number of circuitry columns may be additionally implemented. The set of row driver circuits 510 may include row drivers that receive input vector bits of an input vector. The row drivers may serve as control logic, propagating an activation token to activate (or bypass) rows of the multiply-accumulate circuit. However, instead of a single corresponding memristor (programmed with a corresponding weight bit value), a row driver may control multiple corresponding memristors to support parallel multiply-accumulate computations.

The first circuitry column 520 may include a first set of memristor circuits linked to the set of row driver circuits 510, and the first set of memristor circuits may be programmed with a first weight value. The first circuitry column 520 may also include a sense amplifier linked to the first set of memristor circuits to apply an output voltage based on a current output from a memristor of the first set of memristor circuits, the current output representative of a weight value bit stored by the memristor as well as counter circuitry to store a first counter value and to adjust the first counter value based on a row value output from the set of row driver circuits, the output voltage of the sense amplifier of the first column circuitry, or both.

The second circuitry column 530 may include a similar set components, but programmed and operating to compute a different multiply-accumulate operation. In that regard, the second circuitry column 530 may include second set of memristor circuits also linked to the set of row driver circuits 510, and the second set of memristor circuits may be programmed with a second weight value different from the first weight value. The second circuitry column 530 may also a sense amplifier linked to the second set of memristor circuits to apply an output voltage based on a current output from a memristor of the second set of memristor circuits, the current output representative of a weight value bit stored by the memristor as well as counter circuitry to store a second counter value and to adjust the second counter value based on a row value output from the set of row driver circuits, the output voltage of the sense amplifier of the second circuitry column, or both.

The first circuitry column 520 and the second circuitry column 530 may be implemented according to any of the various example architectures described herein. The counter circuitries of the circuitry columns 520 and 530 may thus support computation of multiply-accumulate operations between input vectors representing actual input vector values $\in \{-1,1\}$ or actual input vector values $\in \{0,1\}$, for example through implementation of counter circuitry 240 or 420 described above. The circuitry columns 520 and 530 may additionally or alternatively operate in conjunction with bypass circuitry implemented by the set of row driver circuits 510, e.g., by implementing counter circuitry that operates consistently with the counter circuitry 340 described in FIG. 3. Circuitry columns of a multiply-accumulate circuit may implement any combination of the features described herein, and different columns may implement the same or varying features.

In operation, the first circuitry column 520 and the second circuitry column 530 may operate in parallel to compute results of a first multiply-accumulate operation between the input vector and the first weight value and a second multiply-accumulate operation between the input vector and the second weight value. As such, the counter circuitry of the first circuitry column 520 may store a result of a first multiply-accumulate operation between the input vector and the first weight value after activation of each row driver that receives an input vector bit having a '1' value (or, after activation of each of the row drivers). The counter circuitry of the second circuitry column 530 may store a result of a second multiply-accumulate operation between the input vector and the second weight value after activation of each of the row driver circuits that receives an input vector bit having a '1' value (or, after activation of each of the row drivers).

Figure 6:
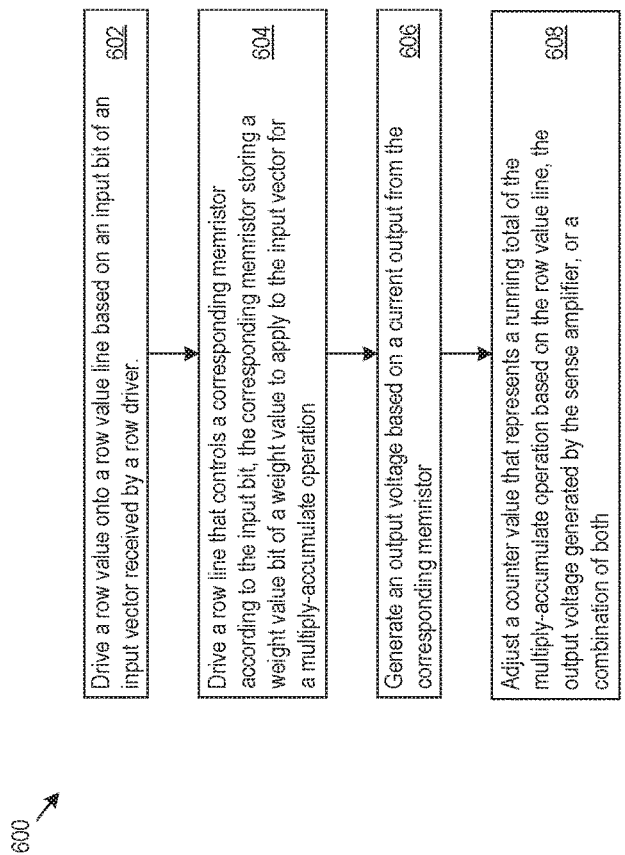
FIG. 6 shows a flow chart of an example method to support performing a multiply-accumulate operation through a multiply-accumulate circuit.

FIG. 6 shows a flow chart of an example method 600 to support performing a multiply-accumulate operation through a multiply-accumulate circuit. Various elements of the multiply-accumulate circuits described herein may perform different steps of the method 600. For example, the method 600 may include driving, by a row driver of a multiply-accumulate circuit, a row value onto a row value line based on an input vector bit of an input vector received by the row driver (602) as well as driving, by the row driver, a row line that controls a corresponding memristor according to the input vector bit (604). The corresponding memristor may store (e.g., be programmed to a resistive state based on) a weight value bit of a weight value to apply to the input vector for a multiply-accumulate operation. The method 600 may further include generating, by a sense amplifier, an output voltage based on a current output from the corresponding memristor (606) and adjusting, by counter circuitry, a counter value that represents a running total of the multiply-accumulate operation based on the row value line, the output voltage generated by the sense amplifier, or a combination of both (608).

In some examples, driving the row line by the row driver includes driving the row line high when the input vector bit has a value of '1' and driving the row line low when the input vector bit has a value of '0'. The row driver may limit driving the row line high or low to when an activation token is local (e.g., stored or latched) by the row driver. The row driver may receiving, by the row driver, an activation token from a previous row driver in the multiply-accumulate circuit and drive the row line as well as the row value line responsive to receiving the activation token. Driving the row line according to the input vector bit may include driving the row line high with a memristor read voltage (e.g., Vread) when the input vector bit is a '1' value and an activation token propagated through the multiply-accumulate circuit is latched by a shift register of the row driver and causing the row line to float otherwise.

In some examples, adjusting the counter value by the counter circuitry may include incrementing the counter value when the input vector bit received by the row driver is a '1' value and the corresponding memristor stores a '1' value for the weight value bit; decrementing the counter value when the input vector bit received by the particular row driver is a '1' value and the corresponding memristor stores a '0' value for the weight value bit; and taking no action when the input vector bit received by the particular row driver is a '0' value. As another example, a '0' value for the input vector bit represents an actual input vector value of '−1' and a '1' value for the input vector bit represents an actual input vector value of '1'. In such an example, adjusting the counter value by the counter circuitry may include incrementing the counter value when (i) both the row value driven by the row driver and the output voltage generated by the sense amplifier is a '0' value or (ii) both the row value driven by the row driver and the output voltage generated by the sense amplifier is a '1' value. Adjusting the counter value may also include decrementing the counter value when (i) the row value driven by the row driver is a '0' value and the output voltage generated by the sense amplifier is a '1' value or (ii) the row value driven by the row driver is a '1' value and the output voltage generated by the sense amplifier is a '0' value.

Although one example is shown in FIG. 6, the method 600 may be ordered in various ways. Likewise, the method 600 may include any number of additional or alternative steps as well, including steps implementing any features with respect to the circuit components described herein such as row drivers, bypass circuitry, counter circuitry, and more.

The systems, methods, devices, circuitry, and logic described above, including the multiply-accumulate circuits, row drivers, sense amplifiers, bypass circuitry, and counter circuitry, may be implemented in many different ways in many different combinations of hardware, logic, circuitry, and executable instructions stored on a machine-readable medium. For example, any of the elements described herein may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. The processing capability of the systems, devices, and circuitry described herein may be distributed among multiple system components, such as among multiple processors and memories, which may include multiple distributed processing systems.

While various examples have been described herein, more implementations are possible.

The invention claimed is:

1. A multiply-accumulate circuit comprising:
   a set of row driver circuits, each row driver of the row driver circuits comprising a shift register that is initialized to a '0' value, wherein each row driver receives an input vector bit of an input vector;
   a token propagation unit configured to propagate a '1' value through the set of row driver circuits;
   a set of memristor circuits linked to the set of row driver circuits, wherein each memristor stores a weight value bit of a weight value to apply to the input vector for a multiply-accumulate operation;
   a sense amplifier linked to the set of memristor circuits to apply an output voltage based on a current output from a memristor of the set of memristor circuits, the current output representative of the weight value bit stored by the memristor; and
   counter circuitry to store a counter value and to adjust the counter value based on a row value output from the set of row driver circuits, the output voltage of the sense amplifier, or both,
   wherein a particular row is activated when the shift register of the row driver of the particular row stores a '1' value.

2. The circuit of claim 1, wherein a particular row driver and a corresponding memristor are active at a particular time; and
   wherein the counter circuitry adjusts the counter value by incrementing, decrementing, or taking no action based on the row value output from the particular row driver and the output voltage applied by the sense amplifier based on the current output of the corresponding memristor circuit.

3. The circuit of claim 2, wherein the counter circuitry is to:
   increment the counter value when the input vector bit received by the particular row driver is a '1' value and the corresponding memristor stores a '1' value for the weight value bit;
   decrement the counter value when the input vector bit received by the particular row driver is a '1' value and the corresponding memristor stores a '0' value for the weight value bit; and
   take no action when the input vector bit received by the particular row driver is a '0' value.

4. The circuit of claim 1, wherein the counter circuitry stores the result of the multiply-accumulate operation between the input vector and the weight value after each row driver and corresponding memristor have been activated.

5. The circuit of claim 1, wherein each memristor stores a '1' value for the weight value bit when the memristor circuit is programmed to a low resistive state and stores a '0' value for the weight bit when the memristor is programmed to a high resistive state.

6. The circuit of claim 5, wherein:
   the '0' value for the weight value bit represents an actual weight value of '−1'; and
   the '1' value for the weight value bit represents an actual weight value of '1'.

7. The circuit of claim 1, wherein each row driver comprises bypass circuitry to bypass activation of the row driver when the input vector bit received by the row driver is a '0' value.

8. The circuit of claim 7, wherein the counter circuitry stores the result of the multiply-accumulate operation between the input vector and the weight value after activation of each row driver that receives an input vector bit having a '1' value and corresponding memristor.

9. The circuit of claim 1, wherein:
   a '0' value for the input vector bit represents an actual input vector value of '−1'; and
   a '1' value for the input vector bit represents an actual input vector value of '1'; and
   wherein the counter circuitry is to adjust the counter value when a particular row is activated by:
   incrementing the counter value when:
     both the row value output by a row driver of the particular row and the output voltage applied by the sense amplifier is a '0' value; or
     both the row value output by the row driver of the particular row and the output voltage applied by the sense amplifier is a '1' value; and
   decrementing the counter value when:
     the row value output by the row driver of the particular row is a '0' value and the output voltage applied by the sense amplifier is a '1' value; or
     the row value output by the row driver of the particular row is a '1' value and the output voltage applied by the sense amplifier is a '0' value.

10. A method comprising:
driving, by a row driver of a multiply-accumulate circuit, a row value onto a row value line based on an input vector bit of an input vector received by the row driver, the row driver comprising a shift register that is initialized to a '0' value, and the driving by the row driver being response to the shift register storing a '1' value propagated by a token propagation unit;
driving, by the row driver, a row line that controls a corresponding memristor according to the input vector bit, the corresponding memristor storing a weight value bit of a weight value to apply to the input vector for a multiply-accumulate operation;
generating, by a sense amplifier, an output voltage based on a current output from the corresponding memristor; and
adjusting, by counter circuitry, a counter value that represents a running total of the multiply-accumulate operation based on the row value line, the output voltage generated by the sense amplifier, or a combination of both.

11. The method of claim 10, wherein driving the row line comprises driving the row line high when the input vector bit has a value of '1' and driving the row line low when the input vector bit has a value of '0'.

12. The method of claim 10, further comprising:
receiving, by the row driver, an activation token from a previous row driver in the multiply-accumulate circuit, the activation token corresponding to the '1' value propagated by the token propagation unit; and
driving the row line and the row value line responsive to receiving the activation token.

13. The method of claim 10, wherein adjusting the counter value by the counter circuitry comprises:
incrementing the counter value when the input vector bit received by the row driver is a '1' value and the corresponding memristor stores a '1' value for the weight value bit;
decrementing the counter value when the input vector bit received by the particular row driver is a '1' value and the corresponding memristor stores a '0' value for the weight value bit; and
taking no action when the input vector bit received by the particular row driver is a '0' value.

14. The method of claim 10, wherein:
a '0' value for the input vector bit represents an actual input vector value of '−1'; and
a '1' value for the input vector bit represents an actual input vector value of '1'; and
wherein the adjusting the counter value by the counter circuitry comprises:
incrementing the counter value when:
both the row value driven by the row driver and the output voltage generated by the sense amplifier is a '0' value; or
both the row value driven by the row driver and the output voltage generated by the sense amplifier is a '1' value; and
decrementing the counter value when:
the row value driven by the row driver is a '0' value and the output voltage generated by the sense amplifier is a '1' value; or
the row value driven by the row driver is a '1' value and the output voltage generated by the sense amplifier is a '0' value.

15. The method of claim 10, wherein driving the row line according to the input vector bit comprises:
driving the row line high with a memristor read voltage when the input vector bit is a '1' value and an activation token propagated through the multiply-accumulate circuit is latched by a shift register of the row driver; and
causing the row line to float otherwise.

16. A multiply-accumulate circuit comprising:
a set of row driver circuits, each row driver of the row driver circuits comprising a shift register that is initialized to a '0' value, wherein each row driver receives an input vector bit of an input vector;
a token propagation unit configured to propagate a '1' value through the set of row driver circuits, wherein a particular row is activated when the shift register of the row driver of the particular row stores a '1' value propagated by the token propagation unit;
a first circuitry column comprising:
a first set of memristor circuits linked to the set of row driver circuits, the first set of memristor circuits programmed with a first weight value;
a sense amplifier linked to the first set of memristor circuits to apply an output voltage based on a current output from a memristor of the first set of memristor circuits, the current output representative of a weight value bit stored by the memristor; and
counter circuitry to store a first counter value and to adjust the first counter value based on a row value output from the set of row driver circuits, the output voltage of the sense amplifier of the first circuitry column, or both; and
a column circuitry column comprising:
a second set of memristor circuits also linked to the set of row driver circuits, the second set of memristor circuits programmed with a second weight value different from the first weight value;
a sense amplifier linked to the second set of memristor circuits to apply an output voltage based on a current output from a memristor of the second set of memristor circuits, the current output representative of a weight value bit stored by the memristor; and
counter circuitry to store a second counter value and to adjust the second counter value based on a row value output from the set of row driver circuits, the output voltage of the sense amplifier of the second circuitry column, or both.

17. The multiply-accumulate circuit of claim 16, wherein the first circuitry column and the second circuitry column operate in parallel to compute results of a first multiply-accumulate operation between the input vector and the first weight value and a second multiply-accumulate operation between the input vector and the second weight value.

18. The multiply-accumulate circuit of claim 16, wherein a particular row driver controls both a corresponding memristor in the first set of memristor circuits and another corresponding memristor in the second set of memristor circuits.

19. The multiply-accumulate circuit of claim 16, wherein:
the counter circuitry of the first circuitry column stores a result of a first multiply-accumulate operation between the input vector and the first weight value after activation of each row driver that receives an input vector bit having a '1' value; and
the counter circuitry of the second circuitry column stores a result of a second multiply-accumulate operation between the input vector and the second weight value after activation of each of the row driver that receives an input vector bit having a '1' value.

* * * * *